United States Patent [19]
Poutasse

[11] Patent Number: 6,117,536
[45] Date of Patent: Sep. 12, 2000

[54] ADHESION PROMOTING LAYER FOR USE WITH EPOXY PREPREGS

[75] Inventor: Charles A. Poutasse, Beachwood, Ohio

[73] Assignee: GA-TEK Inc., Eastlake, Ohio

[21] Appl. No.: 09/151,220

[22] Filed: Sep. 10, 1998

[51] Int. Cl.$^7$ .............................. B32B 9/04; B32B 15/08; B32B 27/04; B32B 27/38
[52] U.S. Cl. ...................................... 428/301.1; 428/301.4; 428/413; 428/418; 428/447; 428/448; 428/450; 428/901
[58] Field of Search ................................ 428/209, 301.1, 428/301.4, 413, 418, 901, 447, 448, 450, 457

[56] References Cited

U.S. PATENT DOCUMENTS

| | | | |
|---|---|---|---|
| 3,970,608 | 7/1976 | Furukawa et al. | 526/19 |
| 4,061,837 | 12/1977 | Hutkin | 428/609 |
| 4,088,544 | 5/1978 | Hutkin | 204/12 |
| 4,409,037 | 10/1983 | Landan | 148/6.14 R |
| 4,505,418 | 3/1985 | Neidig et al. | 228/122 |
| 4,642,161 | 2/1987 | Akahoshi et al. | 156/630 |
| 4,806,200 | 2/1989 | Larson et al. | 156/652 |
| 4,844,981 | 7/1989 | Landau | 428/413 |
| 5,017,271 | 5/1991 | Whewell et al. | 204/15 |
| 5,108,026 | 4/1992 | Su et al. | 228/122 |
| 5,135,629 | 8/1992 | Sawada et al. | 204/192 |
| 5,252,355 | 10/1993 | Ando et al. | 427/98 |
| 5,288,377 | 2/1994 | Johnson et al. | 204/181.3 |
| 5,382,333 | 1/1995 | Ando et al. | 204/130 |
| 5,389,446 | 2/1995 | Yamanishi et al. | 428/472 |
| 5,431,803 | 7/1995 | DiFranco et al. | 205/50 |
| 5,456,817 | 10/1995 | Hino et al. | 205/125 |
| 5,476,908 | 12/1995 | Kishi et al. | 525/393 |
| 5,478,599 | 12/1995 | Iyer et al. | 427/355 |
| 5,492,722 | 2/1996 | Tait et al. | 427/211 |
| 5,552,234 | 9/1996 | Kawasumi | 428/633 |
| 5,597,876 | 1/1997 | Murata et al. | 525/481 |
| 5,618,891 | 4/1997 | Markovitz | 525/481 |
| 5,630,874 | 5/1997 | Tait et al. | 118/234 |
| 5,670,250 | 9/1997 | Sanville, Jr. et al. | 428/323 |
| 5,861,076 | 1/1999 | Adlam et al. | 156/281 |
| 5,863,666 | 1/1999 | Merchant et al. | 428/544 |

OTHER PUBLICATIONS

International Search Report, Application No. PCT/US99/21472, dated Feb. 10, 2000.

*Primary Examiner*—Paul Thibodeau
*Assistant Examiner*—Ramsey Zacharia
*Attorney, Agent, or Firm*—Michael A. Centanni

[57] ABSTRACT

The present invention relates to an adhesion promoting layer which exhibits high temperature stability and high peel strengths when used in a multi-layer structure for a printed circuit board. More specifically, the present invention relates to a multi-layer structure, containing a prepreg layer wherein the prepreg layer is made from an epoxy resin and a non-amine curing agent; and an adhesion promoting layer comprising a nitrogen containing silane compound. The present invention also relates to a multi-layer structure containing a metal foil layer; an epoxy prepreg layer wherein the epoxy prepreg layer is made from an epoxy resin and a non-amine curing agent comprising at least one of an acid, an anhydride, an alkoxide, a phenoxide, a polymeric thiol and a phenol; and an adhesion promoting layer comprising a nitrogen containing silane compound, wherein the adhesion promoting layer is between the metal foil layer and the epoxy prepreg layer.

21 Claims, No Drawings

ADHESION PROMOTING LAYER FOR USE WITH EPOXY PREPREGS

FIELD OF THE INVENTION

The present invention relates to multi-layer structures containing an adhesion promoting layer of a nitrogen containing silane compound. More specifically, the present invention relates to multi-layer structures containing a prepreg layer made from an epoxy resin and an adhesion promoting layer containing a nitrogen containing silane compound.

BACKGROUND OF THE INVENTION

Printed circuit boards may be used as components in electronic devices. PCBs may be made from multi-layer structures which typically comprise a conductive foil, such as copper foil, and a polymeric resin substrate. The conductive foil forms conductors while the polymeric resin substrate (prepreg) provides structural integrity and forms an insulation between the conductors. Since the conductor and insulator are in intimate contact, adhesion between the two contributes to the performance and reliability of the electronic devices made with them.

Electrodeposited and wrought or rolled copper foils used in the manufacture of printed circuit boards often do not adhere well to the polymeric substrates. The prior practice for achieving adhesion between copper foil and insulating polymeric substrates has been to roughen the copper surface.

Surface roughening has been achieved by several means. The electrodeposited copper foils can be electroformed with a rough surface. On top of this rough surface further roughening is carried out by applying a high surface area treatment. These treatments may be a copper deposited electrolytically in nodular or powder form, or a copper oxide which grows nodular or dendritic, among others. Often times the rolled copper foil has mechanical roughness imparted to it during rolling or by subsequent abrasion. The rolled foils also are conventionally treated with surface area increasing nodular copper or copper oxide treatments.

These surface roughening treatments increase adhesion to the polymers by forming a mechanical interlock with the resin. The mechanical interlock is formed when an adhesive in its liquid state is applied and then cured or when the resin melts and flows prior to cure during lamination. The polymers flow around the roughened surface area treatments to form the mechanical interlock. Since, in some instances, surface roughening treatments detrimentally effect the electrical characteristics of conductive metal foil, their use is disfavored in such instances.

There are several factors contributing to the adhesion measured between the copper foil and the polymeric resin. Some of these are surface area, type of roughness, wettability, chemical bond formation, type of chemical bond, formation of interpenetrating networks, and properties of the adhering materials.

During an adhesion test the interlocked resin and copper often adhere well enough that failure occurs within the resin, a cohesive failure. With some resins the mechanical interlocking of treatment and resin does not result in the desired high adhesion and failure occurs at the interface between resin and copper, an adhesive failure.

Various different prepregs have been used to make the polymeric resin substrate. The most common prepregs are epoxy prepregs, polyimide prepregs and polyester prepregs. When a metal foil is laminated to a prepreg, an adhesion promoting layer containing a silane coupling agent may be used to improve adhesive characteristics.

Epoxy resins have been used for the polymeric resin substrate because of their adhesive strength and thermal properties. In fact, epoxy resins are used frequently because they are inexpensive materials yet possess high reliability for extended periods of time. Many epoxy prepregs on the market are made using amine curing agents, such as dicyandiamide, as a crosslinking agent. However, a number of problems are associated with the use of amine curing agents including environmental, safety and handling concerns. Substantial amounts of certain volatile organic compounds (VOC's), such as organic solvents including methyl cellosolve, dimethyl formamide and propylene glycol ether, are typically used with amine curing agents. For safety and environmental reasons, it is desirable to minimize or eliminate the use of VOC's.

Recently, new prepregs based on epoxy resin systems have been introduced into the market place. The new epoxy prepregs are advantageous because they are made without amine curing agents and typically without substantial amounts of VOC's or with less hazardous organics. However, during subsequent processing of a laminate made of a conductive metal foil and a new epoxy prepreg, such as during an acid etch process, peel strength of the laminate is substantially reduced, sometimes completely reduced. The undesirable result is delamination, wherein the laminate is unfit for use. This is because adhesion between the conductive metal foil and the new epoxy prepreg is destroyed in an acid environment.

Therefore, it is desirable to provide multi-layer structures in which conductive metal foils are securely bound to the new epoxy prepregs described above, especially during subsequent processing of the multi-layer structures. It is also desirable to increase or at least maintain adhesion between the conductive metal foils and the new epoxy prepregs while simultaneously exhibiting high temperature stability.

SUMMARY OF THE INVENTION

In one embodiment, the present invention relates to an adhesion promoting layer, which when disposed between a metal foil layer and a prepreg layer in a multi-layer structure for a printed circuit board, contributes to high peel strengths even in an acid environment. More specifically, the present invention relates to a multi-layer structure, containing a prepreg layer wherein the prepreg layer is made from an epoxy resin and a non-amine curing agent; and an adhesion promoting layer comprising a nitrogen containing silane compound.

In another embodiment, the present invention relates to a multi-layer structure containing a metal foil layer; an epoxy prepreg layer wherein the epoxy prepreg layer is made from an epoxy resin and a non-amine curing agent comprising at least one of an acid, an anhydride, an alkoxide, a phenoxide, a polymeric thiol and a phenol; and an adhesion promoting layer comprising a nitrogen containing silane compound, wherein the adhesion promoting layer is between the metal foil layer and the epoxy prepreg layer.

In yet another embodiment, the present invention relates to a multi-layer structure, containing a metal foil layer comprising copper; an epoxy prepreg layer made from an epoxy resin and a non-amine curing agent comprising at least one of an acid, an anhydride and a phenol; and an adhesion promoting layer between the metal foil layer and the epoxy prepreg layer comprising an amino silane compound.

The multi-layer structures of the present invention contain conductive metal foils which are securely bound to the new epoxy prepregs (made with non-amino curing agents), even during subsequent processing of the multi-layer structures. In particular, the multi-layer structures of the present invention are stable in an acid environment. This is because the multi-layer structures of the present invention resist partial and/or complete delamination of the conductive metal foil from the new epoxy prepreg due to acid degredation.

DETAILED DESCRIPTION

The multi-layer structures according to the present invention contain at least two layers. In one embodiment, the multi-layer structure includes at least one metal foil layer and at least one adhesion promoting layer. In another embodiment, the multi-layer structure includes at least one metal foil layer, at least one epoxy prepreg layer, and at least one adhesion promoting layer. The multi-layer structures may further include additional layers.

The multi-layer structures according to the present invention include an epoxy prepreg layer. Useful prepregs, sometimes referred to as dielectric substrates, may be prepared by impregnating woven glass, cellulose, paper sheets or other reinforcement materials with epoxy resins or partially cured epoxy resins.

Epoxy resins used to make the epoxy prepregs in accordance with the invention are made with non-amine curing agents. In other words, the epoxy prepreg resins are not made with amine curing agents such as polyamines such as dicyandiamide, polymethylenediamine, polyetherdiamine and other aliphatic polyamines, alicyclic polyamines such as menthanediamine, and aromatic polyamines such as phenylenediamine, toluenediamine and methylenedianiline.

Epoxy resins are thermosettable resins made from epoxy monomers or epoxy prepolymers and curing agents. Curing agents are coreactive, polyfunctional reagents that possess active hydrogen atoms. Compounds which can be used in preparing the prepregs include monofunctional epoxy resins, difunctional epoxy resins, trifunctional epoxy resins, tetrafunctional epoxy resins, pentafunctional epoxy resins, and blends, mixtures and reaction products thereof. Generally speaking, epoxy resins can be made by reacting epichlorohydrin with mono-, di-, and trihydroxyphenolic compounds, polynuclear polyhydroxy phenolic compounds and/or aliphatic polyols. Examples of di- and trihydroxyphenolic compounds include resorcinol and phloroglucinol; examples of polynuclear polyhydroxy phenolic compounds include bis(p-hydroxyphenyl)methane and 4,4'-dihydroxybiphenyl; and examples of aliphatic polyols include 1,4-butanediol and glycerol. Often the epoxy resins contain bromine atoms for fire retardancy.

An epoxy resin composition is made with an epoxy compound and a curing agent. The curing agent is present in the composition in an amount effective to cure the epoxy compound, which is generally a stoichiometric amount of about 0.75 to about 1.25 equivalents per equivalent of epoxy compound. In terms of weight percent, the curing agent is present in an amount generally from about 10 to about 70 weight percent, preferably from about 15 to about 50 weight percent, most preferably from about 15 to about 40 weight percent, based on the combined weight of epoxy compound and curing agent.

In one embodiment, the curing agent is a compound containing C, H and O atoms and optionally halogen atoms such as Br atoms. Effective curing agents for epoxy resins in accordance with the invention include, for example, acids (especially organic carboxylic acids and acid salts), anhydrides (especially organic acid anhydrides), alkoxides, phenoxides, polymeric thiols and phenols. Phenol curing agents include phenol-novolac compounds, cresol-novolac compounds, other polyhydric phenol compounds, as well as mononuclear aromatic phenols.

Phenol curing agents further include polyvalent phenols, such as resorcinol, catechol, hydroquinone, p-t-butylcatechol, saligenin, bisphenol-A, biphenol, trimethylolallyloxyphenol, trihydroxydiphenyldimethylethane, 4,4'-dihydroybiphenyl, dihydroxydiphenylsulfone, phenol resin, and any corresponding brominated compound.

Acid curing agents include inorganic acids such as mineral acids, and organic acids such as polycarboxylic acids, such as adipic acid, phthalic acid, glutaric acid, malonic acid, succinic acid, maleic acid, fumalic acid, oxalic acid, citraconic acid, itaconic acid, trimellitic acid, pyromellitic acid, cyclopentanetetracarboxylic acid, dimer acid and polyacrylic acid.

Anhydride curing agents include phthalic anhydride, succinic anhydride, itaconic anhydride, citraconic anhydride, alkenyl acid anhydride, dodecenyl succinic anhydride, tricarballyic anhydride, maleic anhydride, maleic anhydride adduct of linoleic acid, copolymer of maleic anhydride with styrene, maleic anhydride adduct of conjugated diene polymer, maleic anhydride adduct of acetylene-conjugated diene random copolymer, maleic anhydride adduct of natural fat, maleic anhydride adduct of methylcyclopentadiene, methyl-2-substituted butenyltetrahydrophthalic anhydride, hexahydrophthalic anhydride, tetrahydrophthalic anhydride, methyltetrahydrophthalic anhydride, pyromellitic anhydride, cyclopentane tetracarboxlic anhydride, benzophenone tetracarboxlic anhydride, ethyleneglycol, bistrimellitate, trimellitic anhydride, dodecylsuccinic anhydride, and dichlorosuccinic anhydride.

In one embodiment, preferred curing agents for epoxy resin compositions are phenolic compounds which have a phenolic functionality greater than about 1.75. The preferred phenolic curing agents are phenolic novolacs prepared by reacting a dihydroxy phenol such as resorcinol or bisphenol-A with formaldehyde in acid solution. The preferred phenolic novolac resin curing agents are bisphenol-A with formaldehyde in acid solution. The preferred phenolic novolac resin curing agents are bisphenol-A novolacs having a weight per phenolic group of about 60 to about 500, preferably about 60 to about 300 and, on the average, more than about 2 phenolic hydroxyl groups per molecule, preferably 3 to about 5. Such phenolic novolac curing agents are available under the trade designation Epikure® from Shell, and in particular Epikure® DX-175.

In a preferred embodiment, the curing agent for the epoxy resin is a bisphenol-A formaldehyde novolac available from Georgia Pacific Resins, Inc. under the trade designation BRWE 5300. This preferred curing agent is made with an acidic catalyst, usually oxalic acid, and is characterized by a melt viscosity of about 800 to about 1600 cps at about 125° C., a hydroxyl equivalent weight of 120, and a Mettler softening point of about 80° C. to about 105° C. Other bisphenol-A formaldehyde novolacs having lower or higher melt viscosities or softening points, indicative of a lower or higher molecular weight, can be used as the optional accelerator, with the preference that their hydroxyl equivalent weight is 120, since bisphenol-A must be used in the acid-catalyzed reaction with formaldehyde in order to yield an accelerator having the desired reactivity properties. In a preferred embodiment, the bisphenol-A formaldehyde novolac is present in an amount less than the stoichiometric level in terms of the epoxy:novolac and epoxy equivalent-:phenolic hydroxyl equivalent ratios.

In applications where flame-proof properties are desired, the curing agent can be a mixture of the phenolic resin curing agent and a brominated phenolic curing agent. The brominated phenolic curing agent can be any monomeric or polymeric compound having at least one free phenolic hydroxyl group and one or more bromine atoms on the aromatic ring. Examples of suitable brominated phenolic curing agents include brominated bisphenol-A novolac, brominated phenolic novolac, brominated polyphenylene oxide, brominated bisphenol-A and brominated bisphenol-A carbonate. The brominated bisphenol-A is present in an amount effective to increase flame retardancy, generally an amount up to about 40 weight percent, usually about 10 to about 30 weight percent, based on the combined weight of the epoxy compound and curing agent.

In order to promote shorter time and/or lower temperature cure of the components of the epoxy resin composition, an optional cure accelerator may be used. Many suitable accelerators, such as ureas, imidazoles, phosphenes, octoates and boron trifluorides, for example, are known in the art. The presently preferred class of accelerators is imidazoles such as 1-methyl imidazoles, 2-ethyl imidazole, 2-methyl imidazole, 2-methyl-4-ethyl imidazole and isopropyl imidazole. Because of its availability and performance characteristics, 2-methyl imidazole is the preferred accelerator. The accelerator is present in the composition in an amount effective to increase the cure rate and/or lower the cure temperature of the composition, generally in an amount from about 0.001 to about 7 weight percent, preferably from about 0.01 to about 3 weight percent, based on the weight of the epoxy resin composition. A cure accelerator is not a curing agent as it does not crosslink with the epoxy resin.

The epoxy resin is designed within certain specifications dictated by the application process parameters of the epoxy prepreg. The epoxy resin formulation typically is a liquid at a temperature at which the epoxy resin does not undergo cure over the time necessary for application of the epoxy resin to the glass substrate. The epoxy resin typically is of sufficiently low viscosity that it achieves good "wetout", or saturation of the web, without the use of a pressure backup roll at the point of application and without the use of substantial amounts of VOC's. Once applied to the substrate, however, the epoxy resin typically has sufficient viscosity so that it does not drop from the epoxy resin—web combination before it reaches the heating zone.

In one embodiment, the epoxy resin has a viscosity in the range of about 0.5 to about 10 poise, and preferably about 0.5 to about 6 poise. In a preferred embodiment, the epoxy resin is a blend of a diglycidyl ether of bisphenol-A having a WPE of about 175–190, a brominated diglycidyl ether of bisphenol-A having a WPE of about 310 to about 350 and a bromine content of about 30–50 percent, a phenolic novolac curing agent, and 2-methylimidazole accelerator.

In one optional embodiment, an epoxy resin which includes an aqueous organic solvent or diluent present in an amount effective to decrease the viscosity of the system for ease of processing may be used. Examples of aqueous or polar organic solvents include ketones, alcohols and glycol ethers. The chosen solvent generally has a boiling point less than about 160° C. The preferred solvents for epoxy resins are ketones, such as acetone, methyl ethyl ketone and methyl isobutyl ketone, for example, and solvent mixtures of these with an alkylene glycol ether such as propylene glycol monomethyl ether. The proportion of solid components in the composition can vary widely depending upon the amount of the other constituents present and the intended application of the composition, but the solvent in a solvent-borne system will generally constitute from about 1 to about 40 weight percent of the total weight of the epoxy resin.

Preferred epoxy resins for the resin composition include epoxy novolacs such as DEN 439 and DEN 438, available from Dow Chemical Co. The DEN 439 resin is characterized by an epoxide functionality of 3.8, an epoxide equivalent weight of 191 to 210, and a Mettler softening point of about 48° C. to about 58° C. DEN 438 is characterized as having an epoxide functionality of 3.6, an epoxide equivalent weight of 176 to 181, and a viscosity of about 20,000 to about 50,000 cps at about 52° C. Another epoxy novolac resin that can be used is DEN 485, also manufactured by Dow Chemical Co. DEN 485 has an epoxide functionality of 5.5, an epoxide equivalent weight of 165 to 195, and a softening point of about 66° C. to about 80° C.

Other epoxy resins include epoxy cresol novolacs made by the Ciba Chemical Co., such as: ECN 1235 with an epoxide functionality of 2.7, an epoxide equivalent weight of 200 to 227, and melting point of about 34° C. to about 42° C.; ECN 1273 with an epoxide functionality of 4.8, an epoxide equivalent weight of 217 to 233, and a melting point of about 68° C. to about 78° C.; ECN 1280 with an epoxide functionality of 5.0, an epoxide equivalent weight of 213 to 233, and melting point of about 78° C. to about 85° C.; and ECN 1299 with an epoxide functionality of 5.4, an epoxide equivalent weight of 217 to 244, and a melting point of about 85° C. to about 100 ° C.

Suitable epoxy resins also include tetra functional phenol such as MT0163, available from Ciba Chemical Co. and having an epoxy functionality of 4, an epoxide equivalent weight of 179 to 200, and a melting point of about 55° C. to about 95° C., and EPON® 1031, available from Shell. and having an epoxide functionality of 3.5, and an epoxide equivalent weight of 200 to 240, which is a solid resin having a kinematic viscosity of about Z2 to about Z7 at about 25° C. as an 80 percent weight solution in methyl ethyl ketone.

Other suitable epoxy resins include modified epoxy novolacs such as EPI-REZ SU resins made by Shell, such as EPI-REZ SU-2.5 with an epoxide functionality of 2.5, an epoxide equivalent weight of 180 to 200, and a melt viscosity of about 2500 to about 4500 centistokes at about 52° C., EPI-REZ SU-3.0 with an epoxide functionality of 3.0, an epoxide equivalent weight of 187 to 211, and a melt viscosity of about 20,000 to about 50,000 centistokes at about 52° C. and EPI-REZ SU-8 with an epoxide functionality of 8.0, an epoxide equivalent weight of 195 to 230, and a melting point of about 77° C. to about 82° C.

A preferred difunctional epoxy resin is the bisphenol-A diglycidyl ether epoxy resin EPON® 826, available from Shell. And characterized by an epoxide functionality of 2, an epoxide equivalent weight of 178 to 186, and a viscosity of about 6500 to about 9500 cps at about 25° C. Offsets of EPON® 826 include Araldite GY 6008 available from Ciba Chemical Co., DER 333 available from Dow Chemical CO., and EPOTUF 37–139 available from Reichold Co.

Other suitable bisphenol-A diglycidyl ether epoxy resins include the following made by Shell: EPON® 828 with an epoxide equivalent weight of 185 to 192 and a viscosity of about 11,000 to about 15,000 cps at about 25° C.; EPON® 830 with an epoxide equivalent weight of 190 to 198 and a viscosity of about 17,700 to about 22,500 cps at about 25° C.; EPON® 1123, a brominated diglycidyl ether of bisphenol-A having a molecular weight of about 800; and EPON® 834 with an epoxide equivalent weight of 230 to 280 and a Gardner-Holdt viscosity O-V at about 25° C. when measured as a 70 percent weight solution in diethylene glycol monobutyl ether.

Suitable bisphenol-F diglycidyl ether epoxy resins include EPON® DPL-862, made by Shell and having an epoxide equivalent weight of 166 to 177 and a viscosity of about 3,000 to about 4,500 cps at about 25° C., and bisphenol-F diglycidyl ether epoxy resins made by Ciba Chemical Co., such as Araldite GY 281 with an epoxide equivalent weight of 158 to 175 and a viscosity of about 5,000 to about 7,000 cps at about 25° C., and Araldite GY 308 with an epoxide equivalent weight of 173 to 182 and a viscosity of about 6,500 to about 8,000 cps at about 25° C.

Other epoxy resins that can be used include cycloaliphatic epoxy resins such as: 3,4-epoxycyclohexymethyl-3,4-epoxycyclohexane carboxylate (ERL 4221 from Union Carbide), with an epoxide equivalent weight of 131 to 143 and a viscosity of about 350 to about 450 cps at about 25° C.; 2-(3,4-epoxy-cyclohexyl-5,5-spiro-3,4-epoxy) cyclohexane metadioxane (ERL 4234 from Union Carbide), with an epoxide equivalent weight of 133 to 154 and a viscosity of about 7,000 to about 17,000 cps at about 38° C.; and 3,4-epoxy-6-methyl-cyclohexylmethyl adipate (ERL 4289 from Union Carbide), with an epoxide equivalent weight of 205 to 216 and a viscosity of about 500 to about 1000 cps at about 25° C. Offsets of any of the epoxy resins made by other manufacturers or mixtures of epoxy resins can also be used.

In another embodiment, the epoxy prepreg is a biphenol-type epoxy resin made from a biphenol compound and a phenol resin curing agent containing C, H and O atoms and optionally bromine atoms. By reacting one or more biphenol compounds with epichlorohydrin to make a bisphenol epoxy resin, and then incorporating the phenol resin curing agent (using conventional methods), a biphenol-type epoxy resin may be obtained. In a preferred embodiment, the phenol resin curing agent is a polyhydric phenol resin curing agent containing C, H and O atoms and optionally bromine atoms.

Examples of biphenol compounds used as a starting material for the production of the biphenol-type epoxy resin include 4,4'-biphenol, 3,3'-dimethyl-4,4-biphenol, 3,5-dibutyl-4,4'-biphenol, 3,3'-diphenyl-4,4'-biphenol, 3,3'-dibromo-4,4'-biphenol, 3,3',5,5'-tetramethyl -4,4'-biphenol, 3,3'-dimethyl-5,5'-dibutyl-4,4'-biphenol, 3,3',5, 5'-tetrabutyl-4,4'-biphenol, 20 3,3',5,5'-tetrabromo-4,4'-biphenol, or the like.

An epoxy resin derived from 3,3',5,5'-tetramethyl-4,4'-biphenol and a mixture of an epoxy resin derived from 3,3',5,5'-tetramethyl-4,4'-biphenol and an epoxy resin derived from 4,4'-biphenol are commercially available from Yuka Shell Epoxy Co. as "EPIKOTE YX4000" (tradename) and "EPIKOTE YL6121" (tradename), respectively.

The phenol resin curing agent which is incorporated in the biphenol epoxy resin is a phenol resin derived from a phenol compound which has one or more phenolic hydroxyl groups on the aromatic ring. In a preferred embodiment, the phenol resin curing agent which is incorporated in the biphenol epoxy resin is a polyhydric phenol resin derived from a polyhydric phenol compound which has two or more phenolic hydroxyl groups attached at adjacent positions on the aromatic ring. Polyhydric phenol compounds having two or more phenolic hydroxyl groups attached at adjacent positions on their aromatic rings may be compounds represented by the following general formulae (I), (II), (III) and (IV):

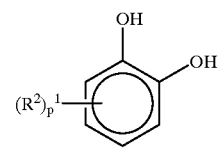

(I)

wherein $R^2$ is an alkyl group of 1 to about 10 carbon atoms, a substituted or unsubstituted phenyl group, a substituted or unsubstituted aralkyl group, an alkoxy group, a hydroxy group or a halogen atom, each $R^2$ being the same or different, and $p^1$ is an integer of 0 to about 2;

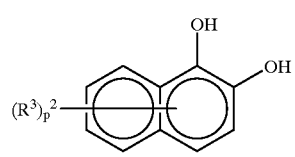

(II)

wherein $R^3$ is an alkyl group of 1 to about 10 carbon atoms, a substituted or unsubstituted phenyl group, a substituted or unsubstituted aralkyl group, an alkoxy group, a hydroxyl group or a halogen atom, each $R^3$ being the same or different, and $p^2$ is an integer of 0 to about 4;

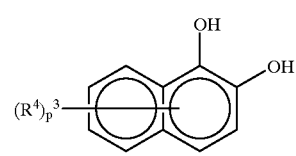

(III)

wherein $R^4$ is an alkyl group of 1 to about 10 carbon atoms, a substituted or unsubstituted phenyl group, a substituted or unsubstituted aralkyl group, an alkoxy group, a hydroxyl group or a halogen atom, each $R^4$ being the same or different, and $p^3$ is an integer of 0 to about 4; and

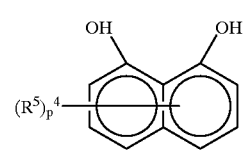

(IV)

wherein $R^5$ is an alkyl group of 1 to about 10 carbon atoms, a substituted or unsubstituted phenyl group, a substituted or unsubstituted aralkyl group, an alkoxy group, a hydroxy group or a halogen atom, each $R^5$ being the same or different, and $p^4$ is an integer of 0 to about 4.

Specific examples of compounds having two or more phenolic hydroxyl groups attached at adjacent positions on their automatic rings include catechol, methylcatechol, dimethylcatechol, butylcatechol, phenylcatechol, methoxycatechol, pyrogallol, hydroxyhydroquinone, tetrahydroxybenzene, bromocatechol, 1,2-dihydroxynaphthalene, methyl-1,2-dihydroxynaphthalene, dimethyl-1,2-dihydroxynaphthalene, butyl- 1,2-dihydroxynaphthalene, methoxy- 1,2- dihydroxynaphthalene, hydroxy-1,2-dihydroxynaphthalene, dihydroxy-1,2-dihydroxynaphthalene, bromo-1,2-dihydroxynaphthalene, 2,3-dihydroxynaphthalene, methyl-2,3-dihydroxynaphthalene, dimethyl-2,3-dihydroxynaphthalene, butyl-2,3-dihydroxynaphthalene, methoxy-2,3-dihydroxynaphthalene, hydroxy-2,3-dihydroxynaphthalene, dihydroxy-2,3-dihydroxynaphthalene, bromo-2,3-dihydroxynaphthalene, 1,8-dihydroxynaphthalene, methyl-1,8-dihydroxynaphthalene, dimethyl-1,8-dihydroxynaphthalene, butyl-1,8-dihydroxynaphthalene, methoxy-1,8-dihydroxynaphthalene, hydroxy-1,8-dihydroxynaphthalene, dihydroxy-1,8-dihydroxynaphthalene, bromo-1,8-dihydroxynaphthalene, and the like.

While the polyhydric phenol resin curing agent in the epoxy resin composition in this embodiment is a polyhydric phenol resin derived from a polyhydric phenol compound which has two or more phenolic hydroxyl groups attached at adjacent positions on the aromatic ring, as described above, there are no particular restrictions on the methods of preparing the polyhydric phenol resin. Generally, although not wishing to be bound by any theory, it is believed that preparation involves oligomerization to a resin of the above mentioned polyhydric phenol compound which has two or more phenolic hydroxyl groups attached at adjacent positions on the aromatic ring, via an addition-condensation reaction with a compound having a carbonyl group, an addition reaction with a compound having a carbonyl group, an addition reaction with a compound having an unsaturated bond, or a condensation reaction with an α-hydroxyalkylbenzene or α-alkoxyalkylbenzene, etc.

The compound having a carbonyl group may be any type of aldehyde or ketone. Examples include formaldehyde, paraformaldehyde, acetaldehyde, benzaldehyde, hydroxybenzaldehyde, glyoxal, terphthalaldehyde, acetone, cyclohexanone, acetophenone, and the like. Examples of compounds having an unsaturated bond include divinylbenzene, diisopropenylbenzene, diisopropenylnaphthalene, dicyclopentadiene, norbornene, a terpene, or the like. Examples of compounds having both a carbonyl group and an unsaturated bond include crotonaldehyde, isopropenylacetophenone, and the like.

Additional specific examples of the polyhydric phenol compound include α-hydroxyalkylbenzenes and α-alkoxyalkylbenzenes, α,α'-dihydroxylene, α,α'-dimethoxyxylene, dihydroxymethylphenol, trihydroxymethylbenzene, trihydroxymethylphenol, dihydroxymethylcresol, tetrahydroxymethylbisphenol A, and the like.

The reaction of the polyhydric phenol compound which has two or more phenolic hydroxyl groups attached at adjacent positions on the aromatic ring with a compound having a carbonyl group, a compound having an unsaturated bond, or an α-hydroxylalkylbenzene or α-alkoxyalkylbenzene for oligomerization to form a resin, may be carried out using any conventional reaction methods. That is, the reaction may be carried out in the presence of an acid catalyst, at a temperature within the range of from about 20° C. to about 200° C., for a period of time of about 1 to about 20 hours.

Acidic catalysts useful for making the polyhydric phenol compound include hydrochloric acid, sulfuric acid, oxalic acid, toluenesulfonic acid, organic acid salts which exhibit acidity, fluoroboric acid, heteropoly acids, activated clay, and the like. The amount of acidic catalyst used is typically from about 0.1 to about 5 parts by weight to 100 parts by weight of the total amount of the phenol compounds. For the reaction, an inert solvent such as, for example, an aromatic hydrocarbon, alcohol, ether or the like may be used, and further a ketone solvent may be used depending upon the conditions of the condensation reaction, such as the catalyst, etc.

Specific examples of commercially available prepared epoxy prepregs (not made with amine curing agents) include those under the trade designations "TS" available from General Electric, "ATS" available from Polyclad, and "Driclad" available from IBM. The commercially available prepared epoxy prepregs have varying glass transition temperatures ($T_g$), typically from about 100° C. to about 200° C. Specific examples include epoxy prepregs (not made with amine curing agents) having a 140° C. $T_g$ or 180° C. $T_g$. Epoxy prepregs are also described in U.S. Pat. Nos. 5,618,891; 5,597,876; 5,492,722; and 5,478,599; the relevant portions of which are hereby incorporated by reference. The relevant portions include descriptions of various epoxy resins and precursors, curing agents containing C, H and O atoms and optionally Br atoms (non-amine curing agents), and methods of making the epoxy resins and epoxy prepregs.

The multi-layer structures of the present invention contain an adhesion promoting layer. The adhesion promoting layer may be located on at least one side of the metal foil layer and/or on at least one side of the epoxy prepreg layer. The adhesion promoting layer may also be located between the metal foil layer and the prepreg layer. In one embodiment, the adhesion promoting layer is characterized by the absence of at least one of chromium and an epoxy silane coupling agent. The adhesion promoting layer contains a nitrogen containing silane compound. Nitrogen containing silane compounds are silane compounds that contain at least one nitrogen atom. Nitrogen containing silane compounds include amino silane compounds (including mono-, di- and tri-amino silane compounds), imidazole silane compounds, pyrrole silane compounds and pyridine silane compounds.

Examples of nitrogen containing silane compounds include aminopropyltrimethoxysilane, aminopropyltriethoxysilane, N-(2-aminoethyl)-3-15 aminopropyltrimethoxysilane, N,N-dimethylaminopropyltrimethoxysilane, N-methyl aminopropyltrimethoxysilane, N-(3-trimethoxysilylpropyl) pyrrole, N-[3-(triethoxysilyl)propyl]-4, 5-dihydroimidazole, β-trimethoxysilylethyl-2-pyridine, N-phenylaminopropyltrimethoxysilane, 3-(N-styrylmethyl-2-aminoethylamino)propyltrimethoxysilane, aminopropylmethyldiethoxysilane, trimethoxysilylpropyl-diethylenetriamine, N-triethoxysilylpropylurea and the like.

The concentration of silane(s) present in a solvent prior to application is in the range of about 0.01 % to about 10% by weight. Preferably, the concentration of the silane(s) in a solvent is in the range of about 0.1% to about 5% by weight. More preferably, the concentration of the silane(s) in a solvent is in the range of about 0.5% to about 2% by weight. Suitable solvents include one or more of water and organic solvents such as alcohols, ketones, cellosolves, tetrahydrofuran, and the like. General methods of preparing silane deposition solutions are known to those skilled in the art.

The metal foil layer used with this invention contains one or more of aluminum, antimony, arsenic, chrome, chromium, cobalt, copper, gold, nickel, phosphorus, platinum, silver, solder, titanium, zinc and combinations and alloys thereof. In a preferred embodiment, the metal foil layer is copper or copper-based alloy foil. These metal foils are known in the art and are made using one of at least two techniques. Wrought or rolled foil is produced by mechanically reducing the thickness of a copper or copper alloy strip or ingot by a process such as rolling. Electrodeposited metal foil is produced by electrolytically depositing metal ions on a rotating cathode drum and then peeling the deposited strip from the cathode. Electrodeposited copper foils are preferred.

The metal foils typically have nominal thicknesses ranging from about 0.0002 inch to about 0.02 inch. Foil thickness is sometimes expressed in terms of weight and typically the metal foils of the present invention have weights or thicknesses ranging from about ⅛ to about 14 oz/ft².

Electrodeposited metal foils have a smooth or shiny (drum) side and a rough or matte (metal deposit growth front) side. The inventive adhesion promoting layer can be adhered to either side of the foil and in some instances is adhered to both sides.

In one embodiment, the side or sides of the foil (electrodeposited or wrought) to which the adhesion promoting layer is adhered is a "standard-profile surface", "low-profile surface" or "very-low-profile surface". The term "standard-profile surface" is used herein to refer to a metal foil surface having an $R_{tm}$ of about 10 μm or less. The term "low-profile surface" refers to a metal foil surface having an $R_{tm}$ of about 7 μm or less. The term "very-low-profile surface" refers to a metal foil surface having an $R_{tm}$ of about 4 μm or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

Although the foils can be subjected to a surface roughening treatment prior to the application of the inventive adhesive, the desired adhesive characteristics for the multilayer structure can be achieved without subjecting the metal foil to an added surface roughening treatment. Thus, in one embodiment of the invention, the metal foil is characterized by the absence of any added surface roughening treatment on the side or sides to which the adhesion promoting layer is adhered. The term "added surface roughening treatment" refers to any treatment performed on a base or raw metal foil that increases the roughness of the surface of the metal foil. In another embodiment of the invention, the metal foil is characterized by the presence of at least one added surface roughening treatment on the side or sides to which the adhesion promoting layer is adhered.

These treatments include copper deposited electrolytically in nodular or powder form and copper oxide which grows nodular or dendritic. In one embodiment, mechanical roughness imparted to wrought metal foil during rolling or by subsequent abrasion which increases roughness beyond that of a standard profile surface is considered to be an added surface roughening treatment. In one embodiment, roughness imparted to an electrodeposited metal foil during electrodeposition which increases roughness beyond that of a standard profile surface is considered to be an added surface roughening. In one embodiment, any roughness imparted to the raw or base metal foil that increases the roughness of said foil beyond that of a standard profile surface is considered to be an added surface roughening treatment. In one embodiment, any roughness imparted to the raw or base metal foil that increases the roughness of said foil beyond that of a low-profile surface is considered an added surface roughening treatment. In one embodiment, any roughness imparted to the raw or base metal foil that increases the roughness of said foil beyond that of a very low-profile surface is considered an added surface roughening treatment.

In one embodiment, the side or sides of the base or raw metal foil to which the adhesion promoting layer is adhered is untreated prior to the application of the adhesion promoting layer to the metal foil. The term "untreated" is used herein to refer to raw or base foil that has not undergone subsequent treatment for the purpose of refining or enhancing the foil properties.

As indicated above, it is within the scope of the invention to apply to metal foils which have been subjected to an added surface roughening treatment the adhesion promoting layer. Thus, in one embodiment, one or both sides of the metal foil are treated with a roughened layer of copper or copper oxide prior to the application of the adhesion promoting layer. The copper can be deposited electrolytically in nodular or powder form. The copper oxide can grow nodular or dendritic.

In one embodiment, the side or sides of the base or raw metal foil to which the adhesion promoting layer is adhered is treated, prior to the application of the adhesion promoting layer with one or more surface treatment layers for the purpose of refining or enhancing the metal foil properties or the properties of the resultant laminate. Any side of the metal foil which does not have the adhesion promoting layer applied to it can, optionally, also have one or more of such treatment layers applied to it. These surface treatments are known in the art.

In one embodiment one or both sides of the metal foil are treated with at least one metallic layer, the metal in said metallic layer being selected from the group consisting of antimony, brass, bronze, cobalt, indium, molybdenum, nickel, tin, zinc and mixtures of two or more thereof, prior to the application of the adhesion promoting layer. Metallic layers of this type are in some instances referred to as barrier layers. These metallic layers preferably have thicknesses in the range of about 0.01 to about 1 micron, more preferably about 0.05 to about 0.1 micron.

In one embodiment one or both sides of the metal foil are treated with at least one metallic layer, the metal in said metallic layer being aluminum, antimony, arsenic, chromium, chromium-zinc alloy, molybdenum, nickel, phosphorus, tin, zinc, or a mixture of two or more thereof, prior to the application of the adhesion promoting layer. Metallic layers of this type are in some instances referred to as stabilization layers. These metallic layers preferably have thicknesses in the range of about 0.005 to about 0.05 micron, more preferably about 0.01 to about 0.02 micron.

In one embodiment, one or both sides of the metal foil are first treated with at least one barrier layer, then at least one stabilization layer, as discussed above, prior to the application of the adhesion promoting layer. In another embodiment, one or both sides of the metal foil are treated with at least one roughened layer of copper or copper oxide, then at least one barrier layer of the type discussed above prior to the application of the adhesion promoting layer. In one embodiment, one or both sides of the metal foil are treated with at least one roughened layer of copper or copper oxide, then at least one stabilization layer of the type discussed above is adhered to the layer of copper or copper oxide prior to the application of the adhesion promoting layer. In one embodiment, one or both sides of the metal foil are treated with at least one roughened layer of copper or copper oxide, then at least one barrier layer of the type discussed above is adhered to the roughened layer, then at least one stabilization layer is adhered to the barrier layer prior to the application of the adhesion promoting layer.

The adhesion promoting layer is adapted for enhancing adhesion between a metal foil layer and a specifically defined epoxy prepreg layer. The adhesion promoting layer is applied to one or both sides of the metal foil, the metal foil surface to which the resulting adhesion promoting layer is applied being untreated or treated as discussed above. The adhesion promoting layer may be applied to the metal foil surface using known application methods which include reverse roller coating, doctor blade coating, dipping, painting and spraying. The process of applying the adhesion promoting layer may be repeated, if desired, several times.

The application of the adhesion promoting layer to the metal foil surface may be typically effected at a temperature of preferably about 15° C. to about 45° C., more preferably about 20° C. to about 30° C. Following application of the adhesion promoting layer to the metal foil surface, the adhesion promoting layer may be semi-cured (B-staged) by heating it to a temperature of preferably about 50° C. to about 200° C., and in one embodiment about 140° C. to 170° C., for preferably about 1 second to about 10 minutes, and in one embodiment about 5 seconds to about 5 minutes to enhance drying of the surface.

The metal copper foils with the B-staged adhesion promoting layer applied thereto generally have a matte-side roughness, $R_{tm}$, of about 2 to about 18 µm, and in one embodiment about 4 to about 11 µm, and in another embodiment about 5 to about 8 µm. In one embodiment of the invention, these foils have weights of about ½ ounce per square foot and the $R_{tm}$ of the matte side is about 2 to about 12 µm, or about 4 to about 8 µm. In one embodiment, these foils have weights of about 1 ounce per square foot and the $R_{tm}$ of the matte side is about 2 to about 16 µm, or about 5 to about 9 µm. In one embodiment, these foils have weights of about 2 ounces per square foot and the $R_{tm}$ of the matte side is about 6 to about 18 µm, or about 8 to about 11 µm. In one embodiment $R_{tm}$ for the shiny side of these foils is less than about 4 µm, or less than about 3 µm, or is in the range of about 1.5 to about 3 µm, or about 2 to about 2.5 µm.

The metal foils with the B-staged adhesion promoting layer applied thereto can be bonded to one or more prepreg layers. The adhesion promoting layer enhances the bond or peel strength between the metal foil layer and the epoxy prepreg layer. An advantage of the metal foils is that the foils can avoid the application of any added surface roughening, yet exhibit effective bond or peel strength with epoxy prepreg layers even in an acid environment. The foils can have a standard profile surface, low-profile surface and even a very low-profile surface, and yet provide acceptable peel strengths. With the metal foils, either the matte side or shiny side can be effectively bonded to a prepreg layer.

In preparing certain embodiments of the multi-layer structure, it is useful for both the epoxy prepreg layer and the metal foil layer to be provided in the form of long webs of material rolled up in rolls. The rolled materials are drawn off the rolls and cut into rectangular sheets. The rectangular sheets are then laid-up or assembled in stacks of assemblages. Each assemblage may comprise one or more epoxy prepreg sheets with a sheet of foil on either side thereof or on one side, and in each instance, the side (or one of the sides) of the metal foil sheet with the adhesion promoting layer adhered thereto is positioned adjacent the epoxy prepreg.

The multi-layer structure may be subjected to conventional laminating temperatures and pressures between the plates of laminating presses to prepare laminates comprising sandwiches of a sheet or sheets of epoxy prepreg between sheets of metal foil. Alternatively, a continuous lamination process may be used where the metal foil and epoxy prepreg are unrolled and passed through a heated press as a continuous web and cut into sheets afterwards.

By application of heat and pressure, the metal foil layer is pressed tightly against the epoxy prepreg layer and the temperature to which the multi-layer structure is subjected activates the resin to cause curing; that is, cross-linking of the resin and thus tight bonding of the metal foil layer to the epoxy prepreg layer. Generally speaking, the laminating operation will involve pressures in the range from about 30 to about 1000 psi, temperatures in the range from about 150° C. to about 250° C. and a laminating cycle in the range from about 50 minutes to about 6 hours. In one embodiment, a continuous lamination process is used under a vacuum or no added pressure is used, the temperature is up to about 200° C., and the lamination time is less than about 30 minutes. The resultant laminate may then be utilized to prepare printed circuit boards (PCB).

The resultant laminate may be subjected to a subtractive metal etching process to form electrically conductive lines or an electrically conductive pattern as part of a process for making a multilayered circuit board.

A second adhesion promoting layer may then be applied over the etched pattern using the techniques discussed above and then a second epoxy prepreg layer adhered to the etched pattern after a second adhesion-promoting layer is positioned between and adhered to both the etched pattern and the second epoxy prepreg layer. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications for the PCBs including electronic devices such as radios, televisions, VCRs, computers, etc, vehicles such as cars, trucks, aircraft, boats, trains, etc., machinery, equipment, telecommunications devices and so on. These methods and end uses are known in the art.

The following examples are provided for purposes of illustrating the invention. Unless otherwise indicated, in the following example as well as throughout the specification and claims, all parts and percentages are by weight, all temperatures are in degrees centigrade, and all pressures are atmospheric.

TABLE 1

| SILANE | INITIAL (lb/in) | FINAL (lb/in) | PERCENT LOSS |
| --- | --- | --- | --- |
| None | 3 | 0.3 | 89 |
| Epoxy | 8.2 | 0.3 | 96.3 |
| Amino | 4.6 | 4.5 | 2.2 |
| Diamino | 3.9 | 3.3 | 15.4 |
| Imidazole | 3.3 | 3.1 | 6.1 |

TABLE 2

| SILANE | INITIAL (lb/in) | FINAL (lb/in) | PERCENT LOSS |
| --- | --- | --- | --- |
| None | 7.1 | 1.2 | 83.1 |
| Epoxy | 12.7 | 5.4 | 57.5 |
| Chloro | 8.3 | 1.6 | 80.7 |
| Amino | 13 | 11.2 | 13.8 |
| Diamino | 12.1 | 11.6 | 4.1 |
| Imidazole | 12.7 | 12 | 5.5 |

TABLE 3

| SILANE | INITIAL (lb/in) | FINAL (lb/in) | PERCENT LOSS |
| --- | --- | --- | --- |
| None | 6.3 | 1.6 | 74.6 |
| Epoxy | 6 | 3.9 | 35 |
| Chloro | 5.8 | 2.4 | 58.6 |
| Amino | 6.3 | 6.1 | 3.2 |
| Diamino | 6.2 | 5.9 | 4.8 |
| Imidazole | 6 | 5.9 | 1.7 |

TABLE 4

| SILANE | INITIAL (lb/in) | FINAL (lb/in) | PERCENT LOSS |
| --- | --- | --- | --- |
| None | 3.6 | 0.2 | 94.4 |
| Epoxy | 8.3 | 2.3 | 72.3 |
| Epoxycyclohexyl | 7.6 | 0.9 | 88.2 |
| Amino | 8 | 4 | 50 |
| Diamino A | 7.8 | 6.6 | 15.4 |
| Diamino B | 7.3 | 5.7 | 21.9 |

TABLE 5

| SILANE | INITIAL (lb/in) | FINAL (lb/in) | PERCENT LOSS |
| --- | --- | --- | --- |
| None | 2.2 | 0.2 | 90.9 |
| Epoxy | 5.7 | 0.2 | 96.5 |
| Epoxycyclohexyl | 4.2 | 0.6 | 85.7 |
| Amino | 7.1 | 5.9 | 16.9 |
| Diamino A | 5 | 3.4 | 32 |
| Diamino B | 4.9 | 3.6 | 26.5 |

TABLE 6

| SILANE | INITIAL (lb/in) | FINAL (lb/in) | PERCENT LOSS |
| --- | --- | --- | --- |
| None | 5 | 1 | 80 |
| Epoxy | 10 | 2.4 | 76 |
| Chloro | 5.9 | 1 | 83 |
| Methacryl | 6 | 1 | 83 |
| Amino | 9.8 | 8.5 | 13 |
| Imidazole | 5.9 | 5.2 | 12 |
| Styryldiamine | 7.8 | 7.3 | 6 |
| Diamino | 8.1 | 7.4 | 9 |

In Tables 1 to 6, the silane denoted by epoxy is 3-glycidoxypropyltrimethoxysilane; chloro is 3-chloropropyltrimethoxysilane; methacryl is 3-methacryloxypropyltrimethoxysilane; styryldiamine is 3-(N-styrylmethyl-2-aminoethylamine)propyltrimethoxysilane; epoxycyclohexyl is 2-(3,4-epoxycyclohexyl)ethyltrimethoxysilane; amino is aminopropyltriethoxysilane; both diamino and diamino A are N-(2-aminoethyl)-3-aminopropyltrimethoxysilane; diamino B is A 120 silane available from OSi/Witco; and imidazole is N-[3-(triethoxysilyl)propyl]-4,5-dihydroimidazole.

Tables 1 to 6 above represent comparisons between the adhesion strength of laminates with various silane compounds with respect to epoxy prepreg layers derived from epoxy resins made with non-amine curing agents as indicated by peel strength. Each of the adhesion promoting layers (silane compound) is applied to copper foil, and then laminated to the epoxy prepreg layers described above. More specifically, about one part of each of the silane compounds are mixed with about 99 parts water, then applied to electrodeposited copper foil. The coated foils are then laminated to an epoxy prepreg at 250 psi pressure, heated to 177° C., and held together for about 1 hours, followed by cooling to room temperature. All of the laminates are imaged and etched to give a pattern of 10 lines, all 0.008 inches (8 mils) wide.

The lines are peeled halfway down to provide an initial peel strength as in the After Thermal Stress section of 2.4.8 of the IPC Test Methods Manual. Then, the patterned laminates are then soaked in a 50% hydrochloric acid solution for either 30 minutes or 60 minutes. For the final peel strength, the soaked 0.008 inch lines are then peeled as in the After Thermal Stress section of 2.4.8 of the IPC Test Methods Manual.

Table 1 reports the results of applying the silane compound to the matte side of 1 ounce copper foil with no additional roughening treatment and using a Polyclad ATS 140° C. $T_g$ epoxy prepreg. The soaking time is 60 minutes. Table 2 reports the results of applying the silane compound to the matte side of 2 ounce copper foil and using a General Electric TS epoxy prepreg. The soaking time is 60 minutes. Table 3 reports the results of applying the silane compound to the matte side of 0.5 ounce copper foil and using a General Electric TS epoxy prepreg. The soaking time is 60 minutes. Table 4 reports the results of applying the silane compound to the shiny side of 1 ounce copper foil that has both roughening and barrier treatments on both sides with a stabilizer treatment and is commonly called double treat foil and using a General Electric TS epoxy prepreg. The soaking time is 30 minutes. Table 5 reports the results of applying the silane compound to the shiny side of 1 ounce copper foil as in Table 4 and using a Polyclad ATS 140° C. $T_g$ epoxy prepreg. The soaking time is 30 minutes. Table 6 reports the results of applying the silane compound to the matte side of 1 ounce copper foil with a roughening treatment, a barrier layer and a stabilizer layer and using a Polyclad ATSS 180° C. $T_g$ epoxy prepreg. The soaking time is 60 minutes.

In one embodiment, comparing the peel strength of a multi-layer structure according to the present invention after soaking in a 50% aqueous HCl solution for 60 minutes to the initial peel strength, the percent loss is typically less than about 25%, and often less than about 20%. In another embodiment, comparing the peel strength of a multi-layer structure according to the present invention after soaking in a 50% aqueous HCl solution for 60 minutes to the initial peel strength, the percent loss is less than about 15%. In yet another embodiment, comparing the peel strength of a multi-layer structure according to the present invention after soaking in a 50% aqueous HCl solution for 60 minutes to the initial peel strength, the percent loss is less than about 10%.

Since the multi-layer structures according to the present invention exhibit unexpectly high peel strengths in an acid environment, the multi-layer structures according to the present invention, which contain epoxy prepregs made with non-amino curing agents, may be safely subjected to acid processes including acid etching processes, acid activating processes and acid cleaning steps without the threat of complete or partial delamination.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A multi-layer structure, comprising:
    a prepreg layer wherein the prepreg layer is made from an epoxy resin and a non-amine curing agent; and
    an adhesion promoting layer comprising a nitrogen containing silane compound.

2. The multi-layer structure of claim 1 further comprising a metal foil layer wherein the adhesion promoting layer is between the metal foil layer and the prepreg layer.

3. The multi-layer structure of claim 2, wherein the metal foil layer comprises copper or a copper alloy.

4. The multi-layer structure of claim 2, wherein the metal foil layer comprises a metallic layer of at least one of aluminum, antimony, arsenic, brass, chromium, cobalt, indium, molybdenum, nickel, phosphorus, tin, or zinc.

5. The multi-layer structure of claim 3, wherein the metal foil layer comprises a metallic layer of at least one of aluminum, antimony, arsenic, chromium, cobalt, indium, molybdenum, nickel, phosphorus, tin, or zinc.

6. The multi-layer structure of claim 1, wherein the prepreg layer is made from an epoxy resin and a curing agent selected from acids, anhydrides, or phenols.

7. The multi-layer structure according to claim 1, wherein the prepreg layer is characterized by the absence of dicyandiamide groups.

8. The multi-layer structure according to claim 1, wherein the non-amine curing agent comprises a phenol curing agent.

9. The multi-layer structure according to claim 1, wherein the nitrogen containing silane compound comprises at least one of aminopropyltrimethoxysilane, aminopropyltriethoxysilane, N-(2-aminoethyl)-3-aminopropyltrimethoxysilane, N,N-dimethylaminopropyltrimethoxysilane, N-methylaminopropyltrimethoxysilane, N-(3-trimethoxysilylpropyl)pyrrole, N-[3-(triethoxysilyl) propyl]-4,5-dihydroimidazole, β-trimethoxysilylethyl-2-pyridine, N-phenylaminopropyltrimethoxysilane, 3-(N-styrylmethyl-2-aminoethylamino)propyltrimethoxysilane, aminopropylmethyldiethoxysilane, trimethoxysilylpropyl-diethylenetriamine, or N-triethoxysilylpropylurea.

10. The multi-layer structure according to claim 1, wherein the nitrogen containing silane compound comprises at least one of aminopropyltrimethoxysilane, aminopropyltriethoxysilane, N-(2-aminoethyl)-3-aminopropyltrimethoxysilane, N,N-dimethylaminopropyltrimethoxysilane, or N-methylaminopropyltrimethoxysilane.

11. A multi-layer structure, comprising:
a metal foil layer;
an epoxy prepreg layer wherein the epoxy prepreg layer is made from an epoxy resin and a non-amine curing agent comprising at least one of an acid, an anhydride, an alkoxide, a phenoxide, a polymeric thiol, or a phenol; and
an adhesion promoting layer comprising a nitrogen containing silane compound, wherein the adhesion promoting layer is between the metal foil layer and the epoxy prepreg layer.

12. The multi-layer structure of claim 11, wherein the non-amine curing agent comprises at least one of an organic acid, an anhydride, or a phenol.

13. The multi-layer structure of claim 11, wherein the metal foil layer comprises copper or a copper alloy.

14. The multi-layer structure of claim 11, wherein the metal foil layer comprises a metallic layer of at least one of aluminum, antimony, arsenic, chromium, cobalt, indium, molybdenum, nickel, phosphorus, tin, or zinc.

15. The multi-layer structure according to claim 11, wherein the epoxy resin comprises an bisphenol-A epoxy resin.

16. The multi-layer structure according to claim 11, wherein the epoxy prepreg layer is characterized by the absence of dicyandiamide groups.

17. The multi-layer structure according to claim 11, wherein the non-amine curing agent comprises a phenol novalac compound or a cresol novalac compound.

18. The multi-layer structure according to claim 11, wherein the non-amine curing agent consists essentially of carbon, hydrogen, and oxygen atoms and optionally bromine atoms.

19. The multi-layer structure according to claim 11, wherein the nitrogen containing silane compound comprises an amino silane compound.

20. The multi-layer structure according to claim 11, wherein the epoxy resin comprises an epoxidized phenolic novalac resin.

21. A multi-layer structure, comprising:
a metal foil layer comprising copper;
an epoxy prepreg layer made from an epoxy resin and a non-amine curing agent comprising at least one of an acid, an anhydride, or a phenol; and
an adhesion promoting layer between the metal foil layer and the epoxy prepreg layer comprising an amino silane compound.

* * * * *